(12) United States Patent
Foong et al.

(10) Patent No.: US 10,578,645 B2
(45) Date of Patent: Mar. 3, 2020

(54) SHORT CONTACT WITH MULTIFUNCTIONAL ELASTOMER

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 0 days.

(21) Appl. No.: 16/026,000

(22) Filed: Jul. 2, 2018

(65) Prior Publication Data

US 2018/0313869 A1    Nov. 1, 2018

Related U.S. Application Data

(63) Continuation-in-part of application No. 14/855,341, filed on Sep. 15, 2015, now Pat. No. 10,018,652.

(30) Foreign Application Priority Data

Sep. 17, 2014    (MY) ........................... PI 2014002670

(51) Int. Cl.
*G01R 1/04*    (2006.01)
*G01R 1/067*   (2006.01)
*G01R 31/28*   (2006.01)

(52) U.S. Cl.
CPC .......... *G01R 1/045* (2013.01); *G01R 1/06716* (2013.01); *G01R 31/2886* (2013.01)

(58) Field of Classification Search
CPC . G01R 1/045; G01R 1/06716; G01R 31/2886
USPC ......... 324/500, 762.01, 754.01–756.05, 761, 324/758.01, 690, 696, 715, 724, 149
See application file for complete search history.

(56) References Cited

U.S. PATENT DOCUMENTS

| 4,655,489 | A | * | 4/1987 | Bisbing | ................ E05C 19/022 |
| | | | | | 292/110 |
| 7,819,672 | B2 | | 10/2010 | Osato | |
| 2010/0022104 | A1 | * | 1/2010 | Osato | .................. G01R 1/0466 |
| | | | | | 439/65 |

* cited by examiner

*Primary Examiner* — Melissa J Koval
*Assistant Examiner* — Trung Nguyen
(74) *Attorney, Agent, or Firm* — Maschoff Brennan

(57) ABSTRACT

An electrical contact for use in an integrated circuit testing apparatus having an elongated electrically conductive contact pin with a contact tip facing upwards at an inner end of the contact pin, a curved bottom surface that allows the contact pin to rock and slide from side to side during testing. An elongated compressible member with a "P-shaped" cross section, with a "vertical portion" which is the upper, curved part of the so-called letter "P" shape adapted to fit snugly within an upward-facing recess on a top part of the contact pin, and a "horizontal portion" which is the trunk or vertical line of the so-called letter "P" shape positions in between and in contact with a lower top surface of the contact pin and a socket roof.

13 Claims, 4 Drawing Sheets

SHORT CONTACT WITH MULTIFUNCTIONAL ELASTOMER

CROSS-REFERENCE TO RELATED APPLICATIONS

This application is a continuation-in-part application of United States application with Ser. No. 14/855,341 filed on Sep. 15, 2015.

FIELD OF INVENTION

The present invention relates generally to electrical contacts, and more specifically to an electrical contact in an integrated circuit testing apparatus.

BACKGROUND OF INVENTION

Radio frequency (RF) semiconductor devices are changing to match the needs of increasingly innovative wireless standards. Signal bandwidths and carrier frequencies supporting greater data throughput rates are increasing over the time. This translates into increasingly complex devices, all of which need to be tested over wider operating ranges. Increased unit counts and multiple production lots are also needed to facilitate statistical correlation.

Signal integrity is the primary criteria in choosing a testing solution for RF device testing.

Many of the current solutions for testing of RF devices find it difficult to meet the required signal integrity due to various factors including the type and length of the contact used. Test contacting solutions using spring probes, which are vertical in connection comes with a longer contact, or conduction, length. The spring probe also comprises a multiple element assembly and this, along with the longer contact length, affects the signal integrity in a negative way.

Another important consideration is the length of the imprint. The length of the imprint is the summation of the length of the contact patch of the contact pin with the contact pad of the device being tested, and the wiping stroke. For very small or irregular sized contact pads, such as corner chamfer or dimple pads, it is crucial to have a short imprint. Solutions such as U.S. Pat. No. 7,819,672 (Osato) have long wiping strokes, which translates into long imprints, and is unsuitable for short or irregular contact pads.

In general, having longer contact pins used in the testing apparatus translates into poorer signal integrity. Also, having a shorter imprint allows testing of devices with smaller contact pads, as well as irregular contact pads as in the case of corner chamfer and dimple pads.

Electrical contacts with short imprints are available, such as that taught in U.S. application Ser. No. 14/855,341 (Foong, et. al.), which is the parent to this current application. One issue with the design taught in that application is the tendency for the contact pins to drop, as is the case for most single elastomer designs. Another issue of that design is that the rectangular elastomer has the propensity to deform over time, which in turn causes a loss of opposing force when compressed.

What is needed in the art is a RF device testing apparatus that maintains good signal integrity and is able to test devices with very small contact pads, or atypically shaped pads such as in corner chamfer and dimple pads, and at the same time preventing dropping of contact pins during assembly and providing a good opposing force to compression for a longer time.

SUMMARY OF INVENTION

The present invention seeks to overcome the aforementioned disadvantages by providing an electrical contact for use in an integrated circuit testing apparatus with a very short rigid contact pin with a short wiping stroke. The contact pin of this invention is an elongated electrically conductive member with a contact tip facing upwards at an inner end of the contact pin, a curved bottom surface that allows the contact pin to rock and slide from side to side during testing. An elongated elastomer (also called compressible member in this patent specification) that has a cross-section in the shape of a letter "P" that has been rotated clockwise by 90°, with a "vertical portion" which forms the upper, curved part of the so-called letter "P" adapted to fit snugly within an upward-facing recess on a top part of the contact pin, and a "horizontal portion" which is the trunk or vertical line of the so-called letter "P" positioned in between and in contact with a lower top surface of the contact pin and a roof of a socket housing, which we call a socket roof.

The "P" shaped elastomer provides multiple functions, as follows:
1) Prevents contact pin from dropping
   a. Friction between the vertical portion of the elastomer and the contact pin recess wall acts to hold the contact pin in place and prevents it from dropping in the vertical direction.
   b. An inner edge of the elastomer where the horizontal portion meets the vertical portion is curved and adapted to receive a hook in the contact pin that hooks onto this portion of the elastomer. This also aids in preventing the contact pin from dropping in the vertical direction.
2) Restricts horizontal movement of the contact pin within a specified range
   a. The contact pin is not hard-stopped by any part of the housing in the horizontal direction and is therefore in a sense "floating" in the horizontal direction. This vertical portion of the elastomer engages or "grips" the recess in the contact pin and thusly limits the motion of the contact pin in the horizontal direction to a predetermined range around a datum or "center" for the initial or starting point of movement of the contact pin in the horizontal direction.
3) Improves electrical contact between contact pin and a load board
   a. When assembled, the horizontal portion of the elastomer is slightly compressed to provide a downward opposing force that acts as a preloading force of the contact pin on a load board located underneath the contact pin.
   b. During testing, when a device-under-test (DUT) is lowered onto the contact tip of the contact pin, the horizontal portion of the elastomer is compressed. This in turn translates into a torsional force in the vertical portion, which finally becomes a downward force on the recess of the contact pin. In this way, electrical contact between the contact pin and the load board is improved as the DUT is lowered onto the contact tip.
4) Prolonging life of elastomer
   a. Separation of compressive and torsional forces within the elastomer acts to prolong an elastic force of the elastomer. In some prior art that use elastomers with just a single "portion", such as a circular or rectangular shaped elastomer, any compressive and torsional (twisting) force acts on the entire elastomer.

This leads more quickly to permanent deformation of the elastomer, which results in a reduction in elastic force. However, in the elastomer of this invention with a defined horizontal portion and vertical portion, the compressive force created during a test is focused towards the horizontal portion, while the torsional force created during a test is focused on the vertical portion. Because of this, the elastomer takes a much longer time to permanently deform, and thus holds elastic force over a longer period of time.

5) Achieving a short wipe stroke on the DUT
   a. The "P" shape of the elastomer allows a short wipe stroke (SWS) of the contact tip against the DUT. The DUT being lowered onto the contact tip causes a compressive force on the horizontal portion of the elastomer. This translates into a clockwise torsional force in the vertical portion of the elastomer. This clockwise torsional force acts on the contact pin recess in an outwards direction, causing the contact pin to slide outwards along the load board. This sliding of the contact pin along the load board enables the contact tip to have a shorter wipe stroke along the DUT contact pad than it would otherwise have, if there was no sliding of the contact pin This invention thus relates to an electrical contact for use in an integrated circuit testing apparatus, comprising: a socket housing which includes a socket roof; a plurality of contact pins arranged in a row, each contact pin comprising a curved bottom surface, a lower top surface adjacent to an upward-facing recess, a higher top surface, and a contact tip; an elongated compressible member that is formed by a vertical portion and a horizontal portion, said vertical portion designed such that each said upward-facing recess of contact pin fits snugly around this vertical portion, and a bottom surface of the horizontal portion is in flush contact with the lower top surface of contact pin, and a top surface of the horizontal portion in contact with a portion of the socket roof.

In a preferred embodiment, the higher top surface and the lower top surface are on a substantially horizontal plane and the higher top surface is positioned higher than the lower top surface.

In another preferred embodiment, on the compressible member, an inner edge where the vertical portion and horizontal portion meet each other is formed into a curved edge. The contact pin has a hook where the higher top surface and upward-facing recess meet each other, such that the hook is adapted to at least partially cling onto the curved inner edge of the compressible member. This substantially prevents the contact pin from falling downwards.

In yet another preferred embodiment, the higher top surface of the contact pin is in contact with a portion of the socket roof when the electrical contact is in an uncompressed state, thereby preventing the contact tip from rising above a pre-determined height. In this way, the socket roof acts as a hard stop to prevent over extension of the contact tip.

In another preferred embodiment, the contact pin has a vertical outer surface that faces outwards and is adjacent to the lower top surface. In this embodiment, this outer surface has enough clearance from the socket housing so that when the contact tip is pressed downwards during a test, the resulting movement of the contact pin does not cause said outer surface or any other part of the contact pin to come into contact with the socket housing. This is true even though the curved bottom surface of the contact pin is allowed to slide along a load board contact pad during testing, which creates a "wiping effect" on the load board.

In a preferred embodiment, the compressible member has a "P-shaped" cross-section, wherein the vertical portion forms the curved upper part of the letter "P" and the horizontal portion forms the vertical line or trunk of the letter "P". The upward-facing recess comprises a concave curve and a bottom side of the vertical portion comprises a convex curve that matches and fits snugly into the said concave curve of the upward-facing recess.

In another preferred embodiment, the compressible member is made of silicon rubber.

The plurality of contacts arranged in a row are all paired with a single compressible member, forming a set. In a preferred embodiment, there are four of these sets arranged around a square configuration within the socket housing.

In a preferred embodiment, the socket housing is made of an engineering plastic such as Torlon.

Other objects and advantages will be more fully apparent from the following disclosure and appended claims.

DETAILED DESCRIPTION OF INVENTION

Figure 1:
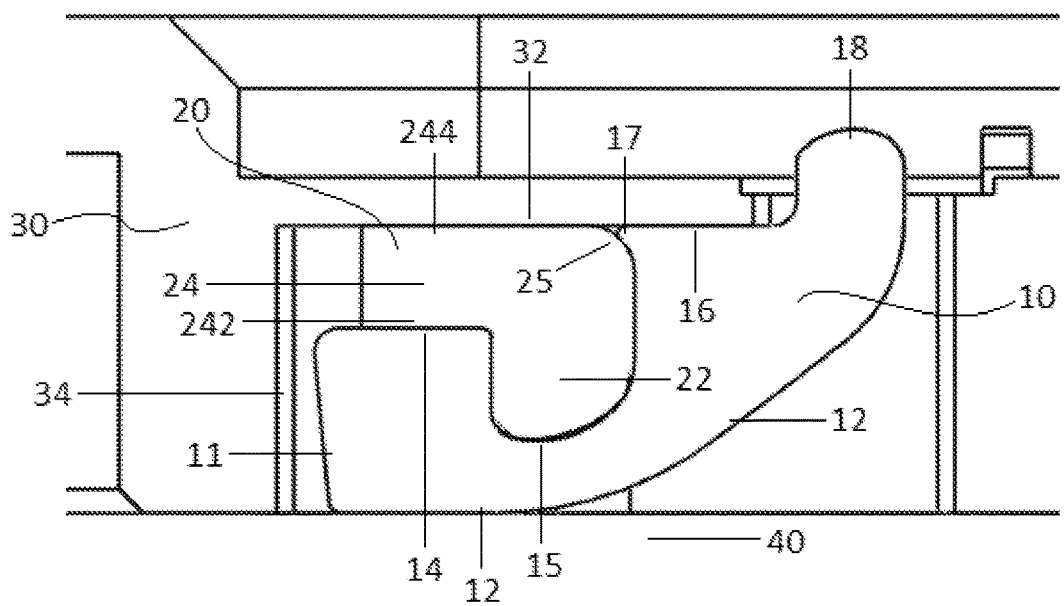
FIG. 1 shows a front cross-sectional view of an electrical contact in an uncompressed state in an embodiment of the present invention.

It should be noted that the following detailed description is directed to an electrical contact of an integrated circuit testing apparatus, and is not limited to any particular size or configuration but in fact a multitude of sizes and configurations within the general scope of the following description.

LIST OF NUMBERED ELEMENTS IN FIGURES

Contact pin (10)
Contact pin outer surface (11)
Contact pin bottom surface (12)
Contact pin lower top surface (14)
Contact pin recess (15)
Contact pin higher top surface (16)
Contact pin hook (17)
Contact pin contact tip (18)
Compressible member (20)
Compressible member vertical portion (22)

Compressible member horizontal portion (24)
Compressible member horizontal portion bottom surface (242)
Compressible member horizontal portion top surface (244)
Compressible member inner edge (25)
Socket housing (30)
Socket roof (32)
Socket wall (34)
Socket cavity (36)
Socket slits (38)
Load board (40)

Referring to FIG. 1 there is shown an electrical contact of this invention in an initial, uncompressed state. A rigid contact pin (10) that comprises a contact tip (18) at an inner end, a curved bottom surface (12) running along a bottom side of the contact pin (10) from the inner end to an outer end, a higher top surface (16) located adjacent to the contact tip (18) and separated from a lower top surface (14) located near the outer end by an upward-facing curved recess (15). The higher top surface (16) is at a higher position than the lower top surface (14), and both are on a substantially horizontal plane. At the outer end of the contact pin (10) and facing outwards is an outer surface (11). Where the higher top surface (16) meets the start of the recess (15), there is a hook (17) comprised of an outward-facing protrusion resembling a cliff.

The terms "elastomer" and "compressible member" mean exactly the same thing and are interchangeable in this patent specification.

An elongated elastomer, or compressible member (20) that has a cross-section in the shape of a letter "P" that has been rotated clockwise by 90°, is provided with a "P-shaped" cross section, with a vertical portion (22) forming the upper, curved part of the so-called letter "P" adapted to fit snugly within the curvature of the upward-facing recess on the contact pin, and a horizontal portion (24) forming the trunk or vertical line of the so-called letter "P" having a bottom surface (242) and a top surface (244).

A socket housing (30) is provided having a socket roof (32) and socket wall (34). The compressible member (20) is sandwiched between the contact pin (10) below and the socket roof (32) above. The hook (17) of the contact pin (10) "hooks" into a crevice formed by the flat socket roof (32) and a curvature of the inner curve (25). This aids in preventing the contact pin (10) from dropping before it is placed on a load board (40). The snug fit of the vertical portion (22) into the recess (15) produces friction between the vertical portion (22) and the wall of the recess (15) which further secures the contact pin (10) and prevents it from dropping.

Once placed onto the load board (40), there is a slight compression of the horizontal portion (24), which creates a downward preloading force of the contact pin (10) on the load board (40) located beneath it.

Figure 2:
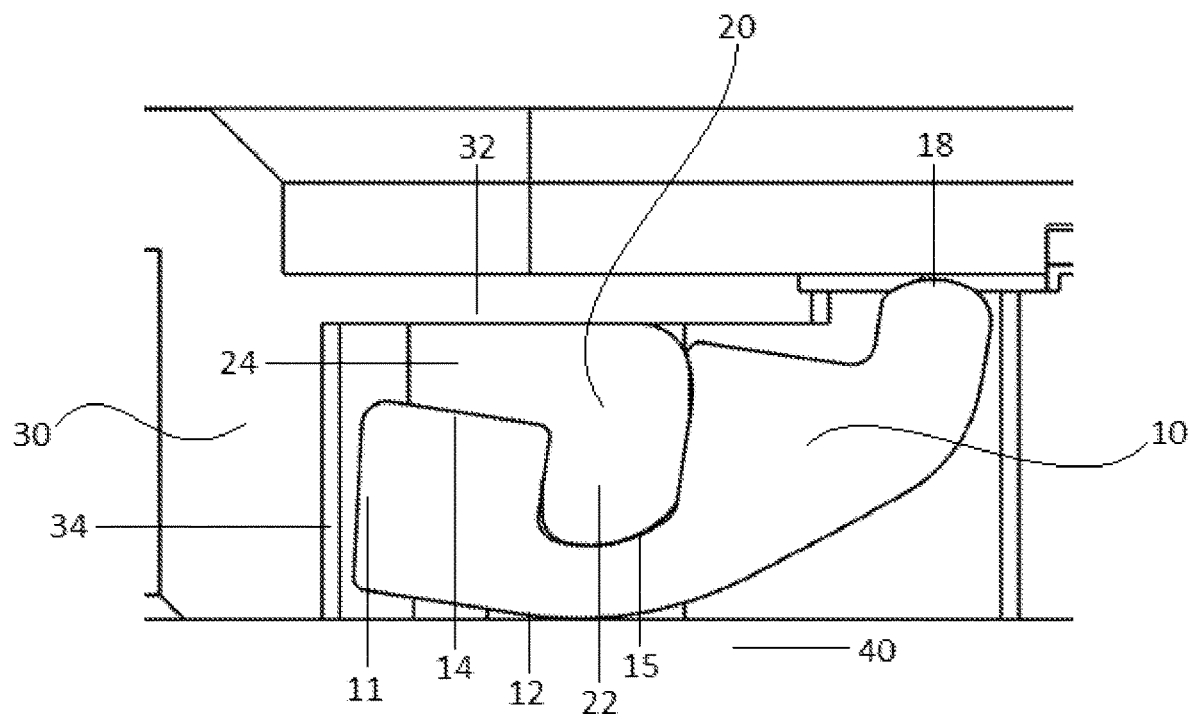
FIG. 2 shows a front cross-sectional view of an electrical contact in a compressed state in an embodiment of the present invention.

Referring to FIG. 2, there is shown an electrical contact of this invention in a compressed state, which is the state it assumes during a test. During a test, a device-under-test (DUT) is lowered onto the contact tip (18). This causes the contact pin (10) to rock in a clockwise direction around a portion of the bottom surface (12) as well as the bottom surface (12) sliding a short distance to the left (or outwards) along the load board (40), such that the lower top surface (14) of the contact pin (10) moves upwards and compresses the horizontal portion (24) of the compressible member (20) against the socket roof (32). This compression of the horizontal portion (24) is transferred to the vertical portion (22) as a clockwise torsional force, which compresses into the recess (15) and provides a downward force of the contact pin (10) into the load board (40). In this way, an electrical contact between the contact pin (10) and the load board (40) is strengthened as the DUT is lowered onto the contact tip (18). This clockwise torsional force in the vertical portion (22) also acts on the recess in an outwards (or left) direction, which causes the contact pin (10) to slide outwards along the load board (40). This sliding of the contact pin (10) along the load board (40) enables the contact tip (18) to have a shorter wipe stroke along the DUT contact pad than it would otherwise have, if there was no sliding of the contact pin (10).

As the DUT is lifted up, an opposing force created by the compression within the compressible member (20) causes the contact pin (10) to rock back in an anti-clockwise direction, and slide back to the right to its initial position. There is provided enough clearance between the outer surface (11) of the contact pin (10) and the socket wall (34) of the socket (30) to allow these movements without the outer surface (11) coming into contact with the socket wall (34), thus reducing wear and tear of the contact pin (10).

Still referring to FIG. 2, it can be seen that the defined horizontal portion (24) and vertical portion (22) allow separation of compressive and torsional forces within the compressible member (20). This acts to prolong an elastic force of the compressible member (20). The compressive stress created during a test is focused towards the horizontal portion (24), while the torsional stress created during a test is focused on the vertical portion (22). Because of this, the elastomer takes a much longer time to permanently deform, and thus holds elastic force over a longer period of time compared to prior art that employ compressible members that are not able to separate the compressive and torsional forces produced by the test.

Figure 3:
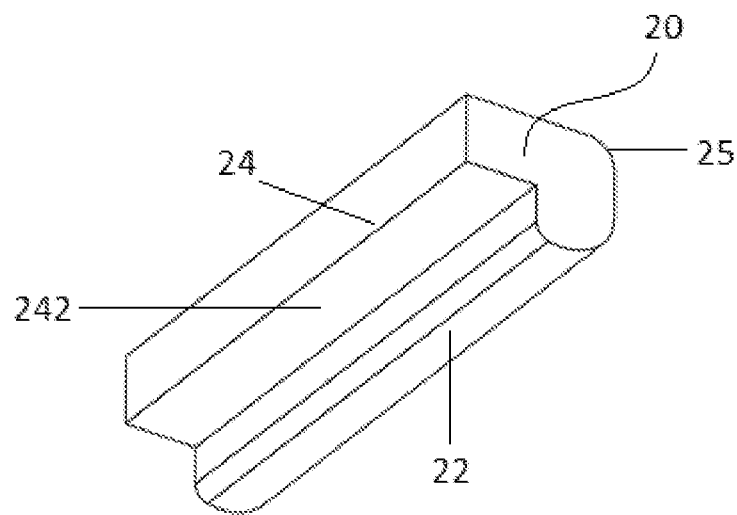
FIG. 3 shows a bottom-up perspective view of a compressible member in an embodiment of the present invention.

FIG. 3 shows a bottom-up perspective view of a compressible member (20) in an embodiment of the present invention. There can be seen the vertical portion (22), the horizontal portion (24), the horizontal portion bottom surface (242), and the inner edge (25).

Figure 4:
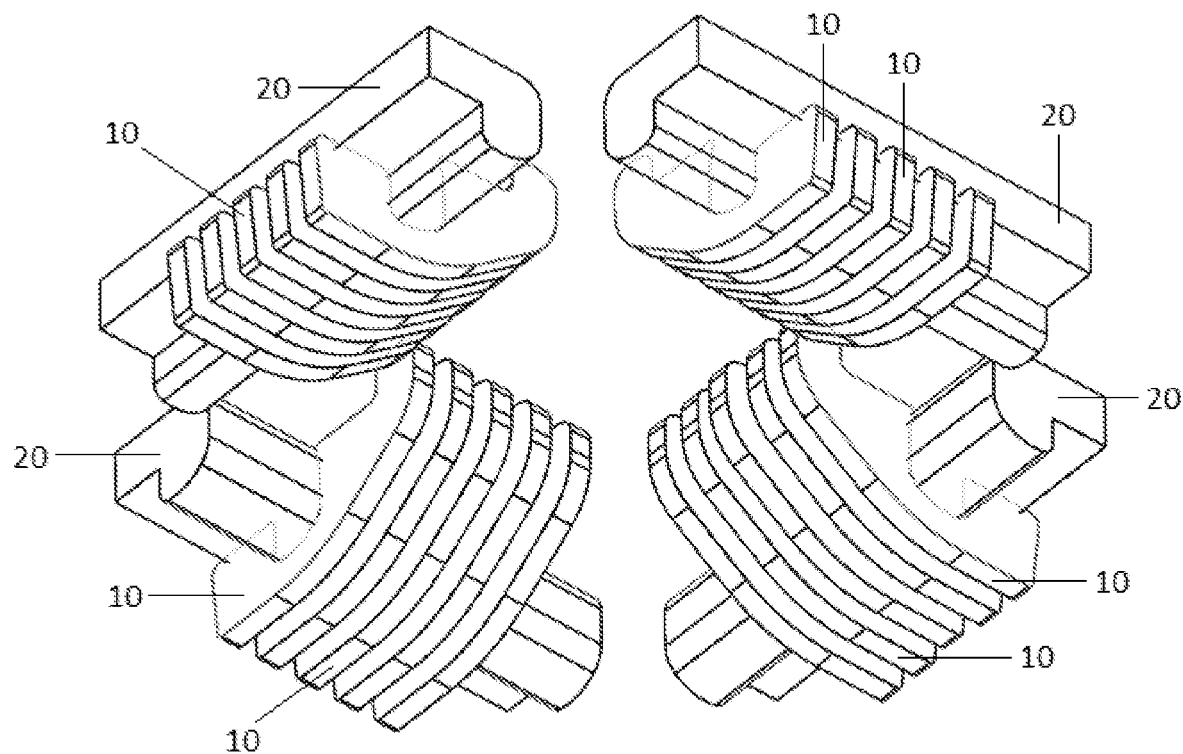
FIG. 4 shows a bottom-up perspective view of four sets of electrical contact and compressible member rows arranged in a square configuration in an embodiment of the present invention.

FIG. 4 shows a bottom-up perspective view of four sets of electrical contact and compressible member rows arranged in a square configuration in an embodiment of the present invention. A plurality of contact pins (10) arranged in a row are paired with a single compressible member (20), forming one set of electrical contacts. A socket housing (30) is provided to secure four of these sets of electrical contacts arranged in a square configuration.

Figure 5:
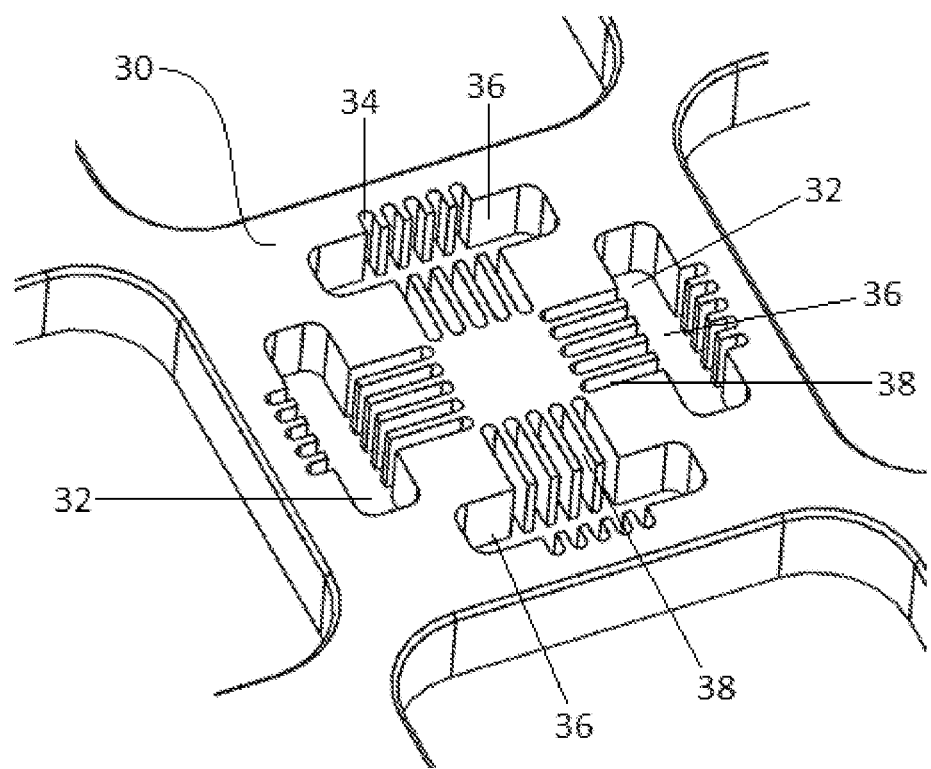
FIG. 5 shows an upside-down perspective view of a socket housing in an embodiment of the present invention.

FIG. 5 shows an upside-down perspective view of a socket housing (30) in an embodiment of the present invention. The socket housing (30) has a square configuration, with a socket cavity (36) cut out near and aligned with each side of the socket housing (30). The socket cavity (36) is cut out a bottom side of the socket housing (30), and there is a layer left at a top side of the socket housing (30), which forms the socket roof (32). Each socket cavity (36) is adapted to receive one compressible member (20). At each socket cavity (36), there is provided further a plurality of socket slits (38) that run perpendicular to the length of the socket cavity (36). Each socket slit (38) is adapted to receive one contact pin (10), after the compressible member (20) has been placed into the socket cavity (36). The socket walls (34) can be seen at outer ends of each socket slit (38).

Figure 6:
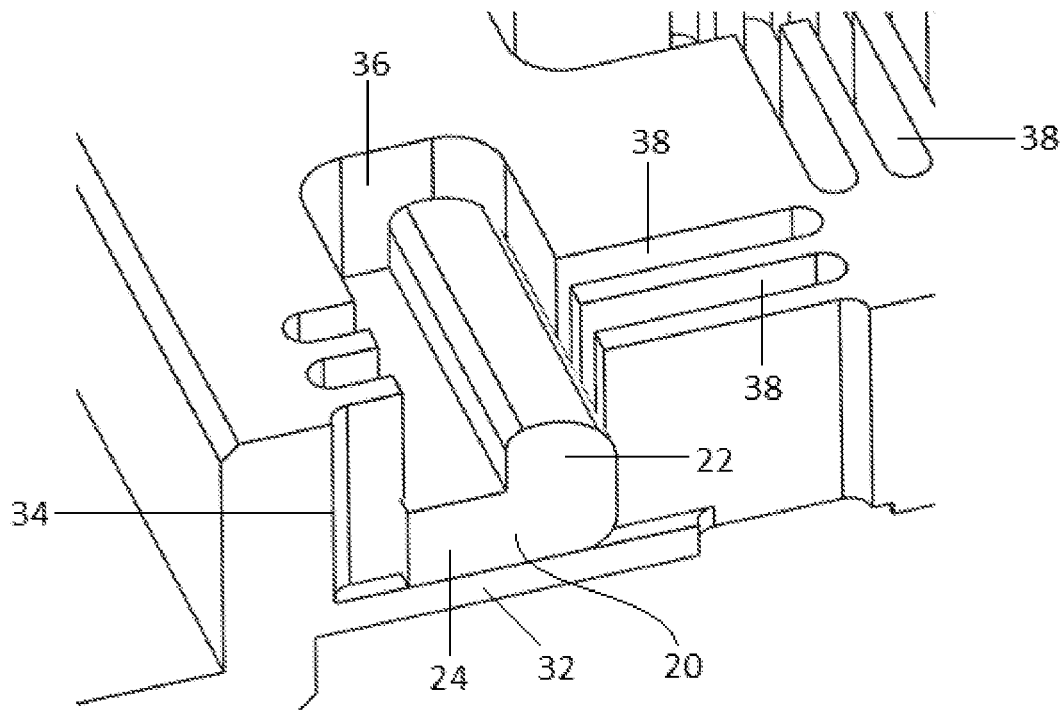
FIG. 6 shows an upside-down perspective cross-sectional view of a socket housing and compressible member in an embodiment of the present invention.

FIG. 6 shows an upside-down perspective cross-sectional view of a socket housing (30) and compressible member (20) in an embodiment of the present invention. This figure shows the compressible member (20) assembled into the socket cavity (36), with the horizontal portion (24) placed in contact with the socket roof (32). The compressible member (20) is held securely within the socket cavity (36) by friction between the compressible member (20) and the walls of the socket cavity (36) as well as slabs formed between the socket slits (38). The socket wall (34) is also shown here.

Figure 7:
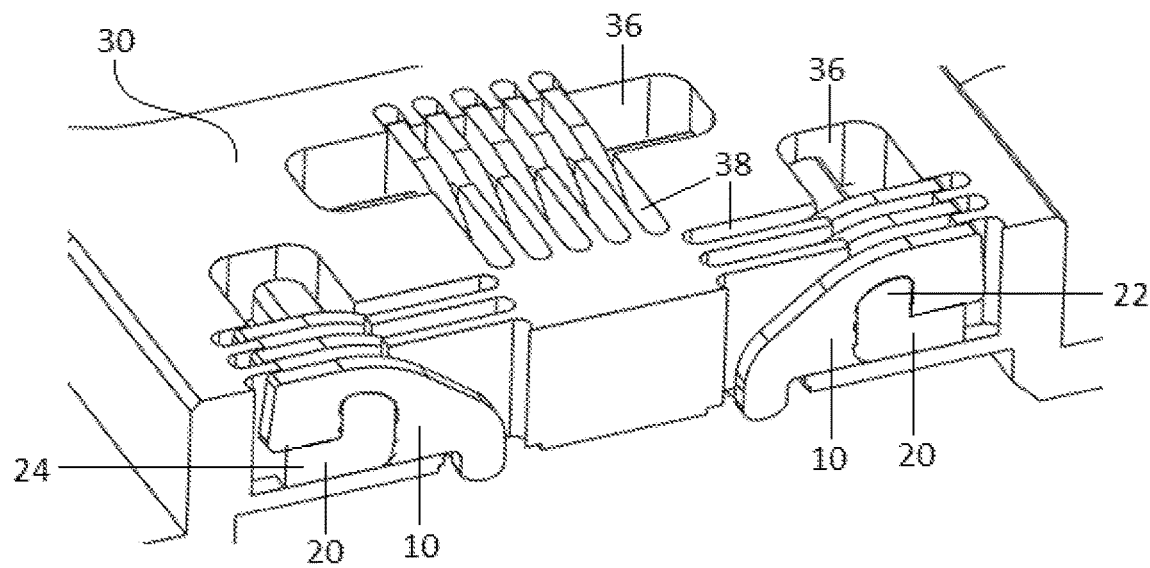
FIG. 7 shows an upside-down perspective cross-sectional view of a complete assembly in an embodiment of the present invention.
Figure 8:
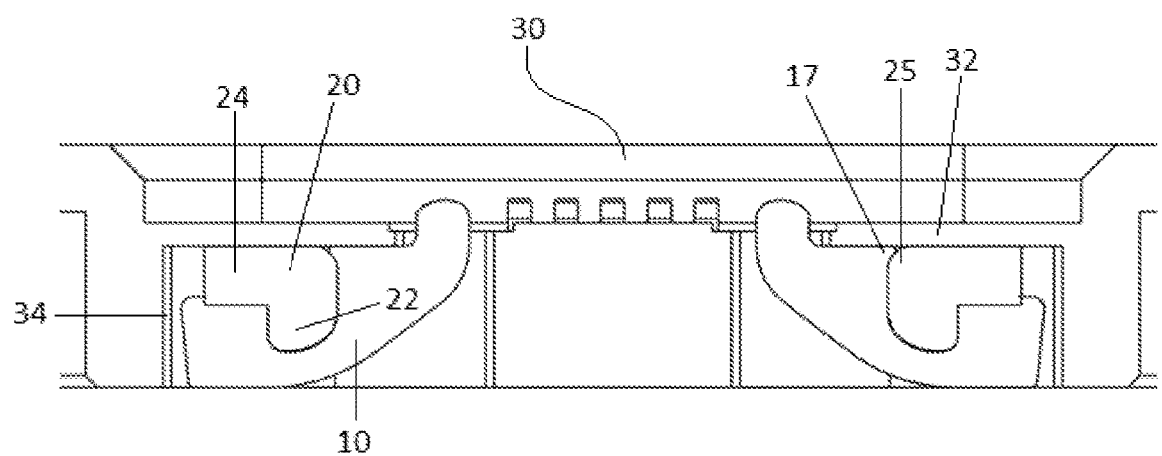
FIG. 8 shows a front cross-sectional view of a complete assembly in an embodiment of the present invention.

FIG. 7 shows an upside-down perspective cross-sectional view of a complete assembly in an embodiment of the present invention. FIG. 8 shows a front cross-sectional view of a complete assembly in the same embodiment, but after the assembly has been turned over right way up. The rows of contact pins (10) are assembled over the compressible members (20), which have in turn been assembled in the socket cavities (36). Each contact pin (10) is slotted into one of the socket slits (38). The hook (17) on each contact pin (10) is secured in a crevice formed by the flat socket roof (32) and the curvature of the inner curve (25) of the compressible member (20). This prevents the contact pin (10) from dropping from assembly when the assembly is flipped over right way up. The orientation of the vertical portions (22) and horizontal portions (24) can be clearly seen within the assembly. The socket wall (34) is shown with clearance from the contact pin (10).

The compressible member (20) of this invention is made of an elastomeric material such as silicon rubber.

The socket housing (30) of this invention is made of an engineering plastic such as Torlon.

The contact pins (10) are made of an electrically conductive material, such as a copper alloy.

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the scope of this invention.

The invention claimed is:

1. An electrical contact for use in an integrated circuit testing apparatus, comprising:
   a socket housing including a socket roof;
   a plurality of contact pins arranged in a row, each said contact pin comprising a curved bottom surface, a lower top surface adjacent to an upward-facing recess, a higher top surface, and a contact tip;
   an elongated compressible member having a P-shaped cross-section that is formed by a vertical portion and a horizontal portion, said vertical portion designed such that each said upward-facing recess fits snugly around it, and a bottom surface of said horizontal portion is in flush contact with said lower top surface, and a top surface of said horizontal portion in contact with a portion of said socket roof,
   wherein an inner edge of said compressible member where the said vertical portion and horizontal portion meet each other is formed into a curve, and the said contact pin further comprises a hook where the said higher top surface and upward-facing recess meet each other, such that said hook is adapted to at least partially cling onto said inner edge, thereby substantially preventing said contact pin from falling downwards.

2. An electrical contact for use in an integrated circuit testing apparatus according to claim 1, wherein the said higher top surface and lower top surface are on a substantially horizontal plane and said higher top surface is positioned higher than said lower top surface.

3. An electrical contact for use in an integrated circuit testing apparatus according to claim 1, wherein a friction between the vertical portion and the recess acts to prevent the contact pin from falling downwards.

4. An electrical contact for use in an integrated circuit testing apparatus according to claim 1, wherein the said higher top surface is in contact with a portion of said socket roof when the electrical contact is in an uncompressed state, thereby preventing said contact tip from rising above a pre-determined height.

5. An electrical contact for use in an integrated circuit testing apparatus according to claim 1, wherein a vertical outer surface of said contact pin adjacent to said lower top surface has enough clearance from said socket housing so that when said contact tip is pressed downwards, the resulting movement of said contact pin does not cause said outer surface to come into contact with said socket housing.

6. An electrical contact for use in an integrated circuit testing apparatus according to claim 1, wherein the upward-facing recess comprises a concave curve and a bottom side of the vertical portion comprises a convex curve that matches and fits snugly into the said concave curve of the upward-facing recess.

7. An electrical contact for use in an integrated circuit testing apparatus according to claim 1, wherein the vertical portion of the compressible member engages or "grips" the recess and thusly limits the motion of the contact pin in the horizontal direction to a predetermined range around a datum or "center" for the initial or starting point of the contact pin in the horizontal direction.

8. An electrical contact for use in an integrated circuit testing apparatus according to claim 1, wherein a compressive stress created during a test is focused towards the horizontal portion, while a torsional stress created during testing is focused on the vertical portion.

9. An electrical contact for use in an integrated circuit testing apparatus according to claim 1, wherein as a device-under-test is lowered onto the contact tip, the horizontal portion is compressed, which produces a torsional force in the vertical portion, which then translates into a downward force on the recess, thusly improving electrical contact between the contact pin and the load board.

10. An electrical contact for use in an integrated circuit testing apparatus according to claim 1, wherein as a device-under-test is lowered onto the contact tip, the horizontal portion is compressed, which produces a torsional force in the vertical portion, which then translates into an outward force on the recess, thus causing the contact pin to slide outwardly along the load board.

11. An electrical contact for use in an integrated circuit testing apparatus according to claim 1, wherein said compressible member is made of silicon rubber.

12. An integrated circuit testing apparatus comprising four sets of said electrical contacts of claim 1 arranged around a square configuration within said socket housing.

13. An integrated circuit testing apparatus according to claim 1, wherein the said socket housing is made of an engineering plastic.

* * * * *